United States Patent [19]

Ballato

[11] Patent Number: 4,836,882

[45] Date of Patent: Jun. 6, 1989

[54] METHOD OF MAKING AN ACCELERATION HARDENED RESONATOR

[75] Inventor: Arthur Ballato, Long Branch, N.J.

[73] Assignee: The United States of America as represented by the Secretary of the Army, Washington, D.C.

[21] Appl. No.: 243,538

[22] Filed: Sep. 12, 1988

[51] Int. Cl.$^4$ .......................... B44C 1/22; B05D 3/06; C23C 14/00; C03C 15/00

[52] U.S. Cl. .................................... 156/626; 156/643; 156/654; 156/663; 204/192.13; 204/192.33; 427/8; 427/38

[58] Field of Search ............... 156/626, 643, 654, 655, 156/663, 601; 204/192.1, 192.11, 192.13–19.32, 192.33; 427/8, 38, 39, 421, 53.1; 219/121 LM

[56] References Cited

U.S. PATENT DOCUMENTS

| | | | |
|---|---|---|---|
| 4,278,492 | 7/1981 | Cross et al. | 156/627 |
| 4,389,275 | 6/1983 | Ballato | 156/626 |
| 4,614,119 | 9/1986 | Zavracky et al. | 156/630 |
| 4,764,244 | 8/1988 | Chitty et al. | 156/656 X |

*Primary Examiner*—William A. Powell
*Attorney, Agent, or Firm*—Sheldon Kanars; Roy E. Gordon

[57] ABSTRACT

An acceleration hardened resonator is made by a method including the steps of:

(A) manufacturing and mounting the resonator, (B) performing acceleration tests to determine the acceleration sensitivity, (C) changing the interaction of the motional distribution with the stress field of the resonator in order to reduce the acceleration sensitivity, and (D) repeating steps (B) and (C) until a minimal acceleration sensitivity is obtained.

33 Claims, No Drawings

METHOD OF MAKING AN ACCELERATION HARDENED RESONATOR

The invention described herein may be manufactured, used, and licensed by or for the Government for governmental purposes without the payment to me of any royalty thereon.

This invention relates in general to a method of making an acceleration hardened resonator and in particular to a method of making such a resonator in which a minimal acceleration sensitivity is obtained.

BACKGROUND OF THE INVENTION

For more than forty years, the problem of acceleration sensitivity of quartz crystal resonators has been with us. Even in the 1940's "shock and vibration" was one of the biggest problems awaiting solution. A variety of approaches have been used: mechanical isolation, using springs and damping elements to reduce the level of distrubance; electrical compensation, using accelerometers to sense the forces and provide input to correction networks; determination of mounting locations on the crystal for the supports to minimize the effect; different crystal cuts; different types of vibrations; different geometrical shapes and aspect ratios; and use of two or more crystal resonators connected electrically, but having reversed axial direction with respect to the acceleration vector. These schemes have met with mixed success.

The average acceleration sensitivity for AT-cut BAW resonators is $\gamma \approx 10^{-9}$ per g or earth gravity unit. Turning a crystal resonator 180° with respect to "down" results in a change of two earth gravity units, so the "2-g tipover" test usually yields a fractional frequency change of $$\left(\frac{\Delta f}{f}\right) = \gamma a \approx \frac{2 \times 10^{-9}}{g} * (2g) \approx 4 * 10^{-9}$$

In many areas of metrology, a change of this size would be considered negligible; but frequency can easily be measured to parts in $10^{13}$, and modern communication and sensing systems require stabilities of such a level that $10^{-9}$ frequency changes are not allowable.

The acceleration level in a helicopter can be $a = 3$ to 6 g's which then introduces a frequency modulation (FM) at the variable rotor blade frequency, rendering certain types of equipment inoperable, and degrading the operation of others. Remotely piloted vehicles (RPV's or UAV's) are similarly affected, as are tanks. In the civilian, commercial sector, cellular radio communications are degraded, and certain modulation schemes cannot be used, or are degraded by the vibration of the using vehicles. Many other examples could be cited; the acceleration problem is the most serious obstacle to be overcome for most applications of crystal resonators (both BAW and SAW) in the HF, VHF, and UHF bands; the same problem exists for dielectric resonator oscillators (DRO's) and magnetostatic wave (MSW) devices at higher frequencies also.

SUMMARY OF THE INVENTION

The general object of this invention is to provide a method of making an acceleration hardened resonator.

A more specific object of the invention is to provide such a method wherein the resulting resonator will have a minimal acceleration sensitivity.

It has now been found that the aforementioned objects can be obtained by a method including the steps of:

(A) manufacturing and mounting the resonator, (B) performing acceleration tests to determine the acceleration sensitivity, (C) changing the interaction of the motional distribution with the stress field of the resonator in order to reduce the acceleration sensitivity, and (D) repeating steps (B) and (C) until a minimal acceleration sensitivity is obtained.

By the motional distribution of the resonator is meant the spatial variation of the particle movement in amplitude, phase, and direction at a given frequency. That is, when a body vibrates, its several parts all show motion. Depending upon the location of the portion of the body, the motion may be large or small and may take place along various directions. Thus, the amplitude and the direction of the motion generally varies with spatial extent along the coordinates of the vibrating body. In particular, in a crystal resonator or vibrator, metallic electrodes are usually employed to allow the imposition of electric driving forces by means of the piezoelectric effect. In the regions where the electric driving forces are greatest, namely, under and near the electrodes, the motional amplitude is usually largest (i.e., this region is on or about an antinode of motion). In general, the distribution of motion in a resonator will be a function of frequency of operation.

As a necessary concomitant of the motional distribution of the resonator, mechanical stresses are produced in the crystal. As with the motion, these stresses vary spatially within the crystalline body and constitute what is called a stress field. The stress field is a function of frequency. When the vibrating crystal body is subjected to acceleration, an additional stress field is created within the crystal and at the boundaries. This latter stress field is a function of, among other things, the direction and strength of the applied acceleration field and the number of locations of the mounting support holding the vibrating crystal body. The acceleration-induced stress field also produces a distribution motion or displacement within the body. The acceleration-induced stress field adds to the stress field due to the motion of the unaccelerated body, and the acceleration-induced displacement adds to the distribution motion of the unaccelerated body.

In the unaccelerated case, the operating frequency of a device is normally chosen at or near the point when the amplitude of motion, averaged over the spatial distribution, is maximum. This is hereafter referred to as the resonance frequency. It can be considered to arise from the interaction of the stress field and the distribution of motion pattern. In the accelerated case, both the motional distribution and the stress field are shifted from those in the unaccelerated case. The interaction term thus is altered and the resonance frequency shifts. The computation of the effect requires the use of non-linear elasticity theory.

The method of the invention is illustrated in the following examples. In the method of the invention, the interaction of the motional distribution with the stress field of the resonator can be changed by an etching method such as ion beam milling, RIE etching, chemical etching, photolytic etching, laser ablation and plasma etching. In the etching method, a multiline raster scan or analog method can be used to carry out the etching. The interaction of the motional distribution with the stress field of the resonator can also be changed by a deposition method such as ion implantation, thermal evaporation, molecular beam epitaxy, electron beam vaporization, anodization, electroplating, liquid-phase epitaxy, sputtering, plasma oxidation, inorganic film deposition, organic film polymerization, chemical vapor deposition, laser assisted chemical vapor deposition, gas phase photolysis, spray coating, alloying, and doping. In the deposition method, a multiline raster scan or analog method can be used to carry out the deposition.

EXAMPLE 1

A bulk acoustic wave quartz crystal AT-cut resonator is desired for use as the frequency stabilizing element of a communication receiver. The resonator is to have a frequency of operation in the VHF band of about 30 to 300 megahertz.

The resonator is fabricated using conventional technology generally involving cutting the crystal plate, X-raying, angle correction, grinding, rounding, lapping, polishing, electroding, mounting, etc.

The resonator unit is then subjected to acceleration tests generally involving a centrifuge or a shake table or a "tip-over" test as well known in the art. These tests establish the magnitude and direction of the acceleration sensitivity vector coefficient gamma which is the proportionality factor relating normalized frequency shift to applied acceleration causing the shift. In the instant case, the magnitude of gamma is about $2 \times 10^{-9}/g$, where g is an earth gravity unit of acceleration.

This value of gamma is too high for the intended application so it is adjusted by the application of an array of gold microspots to the quartz surface of about 0.01 mm to 1.0 mm in diameter and of about 20 to 1000 angstroms in thickness arranged concentrically about a circular electrode, said array being positioned on a circle having a diameter between 10 and 25 percent larger than the diameter of the electrode. The gold microspots that are deposited initially are perferentially located on the arcs of the circle closest to the x axis of the crystal.

The resonator is then remeasured for acceleration sensitivity. The value of gamma is now found to be reduced, but still too large for the intended application. Additional microspots are therefore deposited on the same circular locus but at increasing angles from the x axis of the crystal. The unit is then remeasured for acceleration sensitivity and is found to have an acceptably low gamma.

EXAMPLE 2

The method of Example 1 is repeated except that a second concentric circular locus is established in addition to the first, and microspots are placed thereon. Four subsequent depositions of gold microspots are found necessary to reduce the gamma to an acceptable level.

At times, it may be necessary to increase the number of concentric circles upon which the gold microspots are placed beyond two.

EXAMPLE 3

The method of Example 1 is repeated except that the locus upon which the gold microspots is placed is an ellipse positioned around the electrode.

EXAMPLE 4

The method of Example 2 is repeated except that the concentric circles are concentric ellipses.

EXAMPLE 5

The method of Example 1 is repeated except that the gold microspots are positioned along a straight line, passing through the center of the electrode.

If gamma is found to be insufficiently reduced, a second or more parallel line of gold microspots is provided in a raster scan pattern. These lines do not have to be parallel but could, for example, intersect in the center of the electrodes.

Though the examples show gold microspots deposited on one side of the crystal resonator, the invention encompasses the deposition of gold microspots on both sides of the crystal resonator.

In lieu of the gold deposition taught in the example, one might use other adherent substances such as aluminum, titanium, nickel, chromium, copper, silver, silicon alloys of the above substances; silicon dioxide, silicon monoxide, magnesium fluoride, and similar dielectrics; polymide, epoxy, electrically conducting epoxy, and similar polymeric substances; and other mass loading materials.

EXAMPLE 6

A bulk acoustic wave crystal AT-cut resonator is desired for use as a frequency stabilizing element of a communication receiver. The resonator is to have a frequency of operation in the VHF band of about 30 to 300 MHz.

The resonator is fabricated using conventional technology generally involving cutting the crystal plate, X-raying, angle correcting, grinding, rounding, lapping, polishing, electroding, mounting, etc.

The resonator unit is then subjected to acceleration tests generally involving a centrifuge or shake table or "tip-over" test as well known in the art. These tests establish the magnitude and direction of the acceleration sensitivity vector coefficient gamma.

This value of gamma is too high for the intended application, so it is adjusted by ion beam milling techniques involving eroding the quartz surface in an array of micropits of about 0.01 mm to 10 mm in diameter and of about 20 to 1000 angstroms in depth arranged concentrically about a circular electrode, said array being positioned on a circle having a diameter between 10 and 25 percent larger than the diameter of the electrode. The etched micropits are preferentially located on the arcs of the circle closest to the Z' axis of the crystal.

The resonator is then remeasured for acceleration sensitivity. The value of gamma is now found to be reduced, but still too large for the intended application. Additional micropits are therefore etched on the same circular locus but at increasing angles from the Z' axis of the crystal. The unit is then measured for acceleration sensitivity and is found to have an acceptably low gamma.

EXAMPLE 7

The method of Example 6 is repeated except that a second concentric circular locus is established in addition to the first, and micropits are etched thereon. Four subsequent etchings of micropits are found necessary to reduce the gamma to an acceptable level.

At times, it may be necessary to increase the number of concentric circles upon which the micropits are etched beyond Z.

EXAMPLE 8

The method of Example 6 is repeated except that the locus upon which the micropits are etched is an ellipse positioned around the electrode.

EXAMPLE 9

The method of Example 7 is repeated except that the concentric circles are concentric ellipses.

EXAMPLE 10

The method of Example 6 is repeated except that the micropits are positioned along a straight line passing through the center of the electrode.

If gamma is found to be insufficiently reduced, a second or more parallel line of micropits is provided in raster scan pattern. These lines do not have to be parallel but could for example, intersect in the center of the electrodes.

Though the examples show micropits etched on one side of the crystal resonator, the invention encompasses the erosion of micropits on both sides of the crystal resonator.

Indeed, the invention encompasses the deposition of microspots and the erosion of micropits on both sides of the resonator.

In lieu of the ion beam milling of the micropits taught in the examples, one might use other techniques for erosion such as RIE etching, chemical etching, chemomechanical etching, photolytic etching, laser ablation, and plasma etching.

It is to be noted that there are other methods of changing the interaction of the motional distribution with the stress field of the resonator in order to reduce the acceleration sensitivity besides the deposition and etching methods aforedescribed. For example, one might alter the stress patterns in the electrodes by annealing portions thereof, by shining thereon an electron beam, or an electromagnetic source of energy, causing localized heating and modification of the electrode stress. Then too, one might also alter the stress pattern of the electrodes by alloying a metal with that of the electrodes. In such a case, one could use a copper alloyed electrode in the form of copper microspots placed at repeating intervals on the electrode surface with the application of heat to effect the alloying.

Ion implantation may also be used to effect changing the interaction of the stress field with the motional distribution of the resonator. In the technique, ions of various species are accelerated, and impacted into the crystal resonator structure, where they have the effect of changing the stress field.

One might also establish a static stress bias by the application of longitudinal or shear stresses to the resonator mounting supports for the purpose of compensation of the gamma coefficient.

Applicant points out that the method of the invention is applicable to all types of resonators including piezoelectric resonators such as bulk acoustic wave (BAW), surface acoustic wave (SAW), shallow bulk acoustic wave (BSAW), etc., electromagnetic resonators such as dielectric resonator oscillators (DROs), etc., and magnetostatic wave (MSW) resonators.

I wish it to be understood that I do not desire to be limited to the exact details as described for obvious modifications will occur to a person skilled in the art.

What is claimed is:

1. Method of making an acceleration hardened resonator said method including the steps of:
    (A) manufacturing and mounting the resonator,
    (B) performing acceleration tests to determine the acceleration sensitivity,
    (C) changing the interaction of the motional distribution with the stress field of the resonator in order to reduce the acceleration sensitivity, and
    (D) repeating steps (B) and (C) until a minimal acceleration sensitivity is obtained.

2. Method according to claim 1 wherein in step (C), the interaction of the motional distribution with the stress field of the resonator is changed by an etching method selected from the group consisting of ion beam milling, RIE etching, chemical etching, chemomechanical etching, photolytic etching, laser ablation and plasma etching.

3. Method according to claim 2 wherein the interaction of the motional distribution with the stress field of the resonator is changed by ion beam milling.

4. Method according to claim 2 wherein the interaction of the motional distribution with the stress field of the resonator is changed by RIE etching.

5. Method according to claim 2 wherein the interaction fo the motional distribution with the stress field of the resonator is changed by chemical etching.

6. Method according to claim 2 wherein the interaction of the motional distribution with the stress field of the resonator is changed by chemomechanical etching.

7. Method according to claim 2 wherein the interaction of the motional distribution with the stress field of the resonator is changed by photolytic etching.

8. Method according to claim 2 wherein the interaction of the motional distribution with the stress field of the resonator is changed by laser ablation.

9. Method according to claim 2 wherein the interaction of the motional distribution with the stress field of the resonator is changed by plasma etching.

10. Method according to claim 2 wherein the etching is carried out by the use of multi-line raster scan.

11. Method according to claim 2 wherein the etching is carried out by analog method.

12. Method according to claim 1 wherein in step (C) the interaction of the motional distribution with the stress field of the resonator is changed by a deposition method selected from the group consisting of ion implantation, thermal evaporation, molecular beam epitaxy, electron beam vaporization, anodization, electroplating, liquid-phase epitaxy, sputtering, plasma oxidation, inorganic film deposition, laser-assisted CVD, gas phase photolysis, spray coating, alloying, and doping.

13. Method according to claim 12 wherein the interaction of the motional distribution with the stress field of the resonator is changed by ion implantation.

14. Method according to claim 12 wherein the interaction of the motional distribution with the stress field of the resonator is changed by thermal evaporation.

15. Method according to claim 12 wherein the interaction of the motional distribution with the stress field of the resonator is changed by molecular beam epitaxy.

16. Method according to claim 12 wherein the interaction of the motional distribution with the stress field of the resonator is changed by electron beam vaporization.

17. Method according to claim 12 wherein the interaction of the motional distribution with the stress field of the resonator is changed by anodization.

18. Method according to claim 12 wherein the interaction of the motional distribution with the stress field of the resonator is changed by electroplating.

19. Method according to claim 12 wherein the interaction of the motional distribution with the stress field of the resonator is changed by liquid-phase epitaxy.

20. Method according to claim 12 wherein the interaction of the motional distribution with the stress field of the resonator is changed by sputtering.

21. Method according to claim 12 wherein the interaction of the motional distribution with the stress field of the resonator is changed by plasma oxidation.

22. Method according to claim 12 wherein the interaction of the motional distribution with the stress field of the resonator is changed by inorganic film deposition.

23. Method according to claim 12 wherein the interaction of the motional distribution with the stress field of the resonator is changed by organic film polymerization.

24. Method according to claim 12 wherein the interaction of the motional distribution with the stress field of the resonator is changed by chemical vapor deposition.

25. Method according to claim 12 wherein the interaction of the motional distribution with the stress field of the resonator is changed by laser-assisted chemcial vapor deposition.

26. Method according to claim 12 wherein the interaction of the motional distribution with the stress field of the resonator is changed by gas phase photolysis.

27. Method according to claim 12 wherein the interaction of the motional distributionwith the stress field of the resonator is changed by spray coating.

28. Method according to claim 12 wherein the interaction of the motional distribution with the stress field of the resonator is changed by alloying.

29. Method according to claim 12 wherein the interaction of the motional distribution with the stress field of the resonator is changed by doping.

30. Method according to claim 12 wherein the deposition is carried out by the use of a multi-line raster scan.

31. Method according to claim 12 wherein the deposition is carried out by an analog method.

32. Method according to claim 1 wherein in step (C), the interaction of the motional distribution with the stress field of the resonator is changed by annealing portions of the electrode, by shining thereon an electron beam.

33. Method according to claim 1 wherein in step (C), the interaction of the motional distribution with the stress field of the resonator is changed by annealing portions of the electrode, by shining thereon an electromagnetic source of energy.

* * * * *